US008836444B2

(12) United States Patent
Lopez et al.

(10) Patent No.: US 8,836,444 B2
(45) Date of Patent: Sep. 16, 2014

(54) FREQUENCY STABILIZATION IN NONLINEAR MEMS AND NEMS OSCILLATORS

(75) Inventors: Omar Daniel Lopez, Chicago, IL (US); Dario Antonio, Rio Negro (AR)

(73) Assignee: Uchicago Argonne, LLC, Chicago, IL (US)

(*) Notice: Subject to any disclaimer, the term of this patent is extended or adjusted under 35 U.S.C. 154(b) by 266 days.

(21) Appl. No.: 13/428,833

(22) Filed: Mar. 23, 2012

(65) Prior Publication Data

US 2013/0249630 A1    Sep. 26, 2013

(51) Int. Cl.
*H03L 5/00*    (2006.01)
(52) U.S. Cl.
USPC ............ 331/182; 331/183; 331/185; 331/186
(58) Field of Classification Search
USPC ..... 331/107 R, 116 R, 116 M, 154, 182, 183, 331/185, 186; 330/137
See application file for complete search history.

(56) References Cited

U.S. PATENT DOCUMENTS 7,042,213 B2 *    5/2006    Greywall ...................... 324/244

OTHER PUBLICATIONS

Nguyen, Clark T.-C., MEMS Technology for Timing and Frequency Control, Feb. 2007, IEEE Transactions on Ultrasonics, Ferroelectrics, and Frequency Control, vol. 54, No. 2, pp. 251-270.

Yang, Y.T., et al., Zeptogram-Scale Nanomechanical Mass Sensing, Mar. 15, 2006, NANO Letters, vol. 6, No. 4, Apr. 2006, American Chemical Society, pp. 583-586.
Decca, R.S., et al., Constraining New Forces in the Casimir Regime Using the Isoelectric Technique, Jun. 24, 2005, Physical Review Letters, PRL 94, 240401 (2005), The American Physical Society, pp. 240401-1-240401-4.
Stowe, T.D., et al., Attonewton force detection using ultrathin silicon cantilevers, Jul. 14, 1997, Applied Physics Letter 71(2), Jul. 14, 1997, American Institute of Physics, pp. 288-290.
Rugar, D., et al., Single spin detection by magnetic resonance force microscopy, Jul. 15, 2004, Nature vol. 430, Jul. 15, 2004, www.nature.com/nature, 2004 Nature Publishing Group, pp. 329-332.
Bishop, David, et al., The Little Machines That are Making it Big, Oct. 2001 Physics Today 54(10), 2001 American Institute of Physics, pp. 38-44.
Ekinci, K.L., et al., Nanoelectromechanical systems, 2005, Review of Scientific Instruments 76, 061101 (2005), 2005 American Institute of Physics, pp. 061101-1-061101-12.
Yurke, B., et al., Theory of amplifier-noise evasion in an oscillator employing a nonlinear resonator, May 1995, Physical Review, A vol. 51, No. 5 May 1995 The American Physical Society, pp. 4211-4229.

(Continued)

*Primary Examiner* — Joseph Chang
*Assistant Examiner* — Jeffrey Shin
(74) *Attorney, Agent, or Firm* — Foley & Lardner LLP

(57) ABSTRACT

An illustrative system includes an amplifier operably connected to a phase shifter. The amplifier is configured to amplify a voltage from an oscillator. The phase shifter is operably connected to a driving amplitude control, wherein the phase shifter is configured to phase shift the amplified voltage and is configured to set an amplitude of the phase shifted voltage. The oscillator is operably connected to the driving amplitude control. The phase shifted voltage drives the oscillator. The oscillator is at an internal resonance condition, based at least on the amplitude of the phase shifted voltage, that stabilizes frequency oscillations in the oscillator.

18 Claims, 11 Drawing Sheets

(56) References Cited

OTHER PUBLICATIONS

Lee, H.K., et al., Verification of the Phase-Noise Model for Mems Oscillators Operating in the Nonlinear Regime, M3 p. 124, Transducers' 11, Beijing, China, Jun. 5-9, 2011, pp. 510-513.

Ward, Paul, et al., Oscillator Phase Noise: Systematic Construction of an Analytical Model Encompassing Nonlinearity, IEEE Transactions on Ultrasonics, Ferroelectrics, and Frequency Control, vol. 58, No. 1, Jan. 2011, pp. 195-205.

Cleland, A.N., et al., Noise processes in nanomechanical resonators, Sep. 1, 2002, Journal of Applied Physics vol. 92, No. 5, 2002 American Institute of Physics, pp. 2758-2769.

Knobel, Robert, et al., Nanometre-scale displacement sensing using a single electron transistor, Jul. 17, 2003, letters to nature, Nature/vol. 424/Jul. 17, 2003/www.nature.com/nature, 2003 Nature Publishing Group, pp. 291-293.

Feng, X.L., et al., A self-sustaining ultrahigh-frequency nanoelectromechanical oscillator, May 25, 2008, nature nanotechnology/vol. 3/Jun. 2008/www.nature.com/naturenanotechnology, 2008 Nature Publishing Group, pp. 342-346.

Lin, Yu-Wei, et al., Series-Resonant VHF Micromechanical Resonator Reference Oscillators, Dec. 2004, IEEE Journal of Solid-State Circuits, vol. 39, No. 12, Dec. 2004, 2004 IEEE, pp. 2477-2491.

Postma, H.W., et al., Dynamic range of nanotube- and nanowire-based electromechanical systems, May 25, 2005, Applied Physics Letters 86, 223105 (2005), American Institute of Physics, pp. 223105-1-223105-3.

Agarwal, Manu, et al., Amplitude Noise Induced Phase Noise in Electrostatic Mems Resonators, Current address—BOSCH Research and Technology Centre, Palo Alto, CA, 4 pgs; no date listed, but believed to be published prior to the Mar. 23, 2012 filing date of the present application is.

Agarwal, Manu, et al., A study of electrostatic force nonlinearities in resonant microstructures, 2008, Applied Physics Letters 92, 104106 (2008), pp. 104106-1-104106-3.

Feng, X.L., et al., Phase Noise and Frequency Stability of Very-High Frequency Silicon Nanowire Nanomechanical Resonators, Jun. 10-14, 2007, Transducers & Eurosensors '07, The 14$^{th}$ International Conference on Solid-State Sensors, Actuators and Microsystems, Lyon, France, pp. 327-330.

Hopcroft, M.A., et al., A High-Stability Mems Frequency Reference, Jun. 10-14, 2007, Transducers & Eurosensors '07, The 14$^{th}$ International Conference on Solid-State Sensors, Actuators and Microsystems, Lyon, France, pp. 1307-1309.

Zhang, Rufan, et al., Superstrong Ultralong Carbon Nanotubes for Mechanical Energy Storage, 2011, Advanced Materials, www.advmat.de, 2011, 28, Wiley-VCH Verlag GmbH & Co. KGaA, Weinheim, pp. 3387-3391.

Ward, Paul, et al., Oscillator Phase Noise: Systematic Construction of an Analytical Model Encompassing Nonlinearity, Jan. 2011, IEEE Transactions on Ultrasoncis, Ferroelectrics, and Frequency Control, vol. 58, No. 1, Jan. 2011, pp. 195-205.

Knobel, Robert G., et al., Nanometre-scale displacement sensing using a single electron transistor, Jul. 17, 2003, letters to nature, Nature/vol. 424/Jul. 17, 2003/www.natrue.com/nature, 2003 Natrue Publishing Group, pp. 291-293.

Feng, X.L., et al., A self-sustaining ultrahigh-frequency nanoelectromechanical oscillator, Jun. 2008, nature nanotechnology/vol. 3/Jun. 2008/www.nature.com/naturenanotechnology, pp. 342-346.

Lin, Yu-Wei, et al., Series-Resonant VHF Micromechanical Resonator Reference Oscillators, Dec. 2004, IEEE Journal of Solid-State Circuits, vol. 39, No. 12, Dec. 2004, pp. 2477-2491.

Dürr, Peter, et al. A New Driving Principle for Micromechanical Torsional Actuators, 1999, MEMS—vol. 1, Microelectromechanical Systems (MEMS), pp. 333 338.

Audoin, C., et al., The Measurement of Time: Time, Frequency, and the Atomic Clock, Cambridge University Press, New York, 2001.

Pikovsky, A., et al., Synchronization: a universal concept in nonlinear sciences, Cambridge University Press, New York, 2003.

Cleland, A. C., Foundations of nanomechanics: from solid theory to device applications, Springer-Verlag, New York, 2003.

Nayfeh, A.H., et al., Forced Oscillations of Systems Having a Single Degree of Freedom, Nonlinear Oscilations, Wiley Classics Library Edition, John Wiley & Sons, 1995, Chp. 4, pp. 162-169.

Senturia, S.D., Microsystem Design, Springer, New York, 2001.

Schenk, H., et al., A New Driving Principle for Micromechanical Torsional Actuators, MEMS—vol. 1, Micorelectromechanical Systems (MEMS), 1999, Nashville, USA, pp. 333-338.

Landau, L.D., et al., Theory of Elasticity, Court of Theoretical Physics, Addison-Wesley, 1964, Chp. III, p. 113.

* cited by examiner

FREQUENCY STABILIZATION IN NONLINEAR MEMS AND NEMS OSCILLATORS

GOVERNMENT INTEREST

The United States Government has rights in this invention pursuant to Contract No. DE-AC02-06CH11357 between the United States Department of Energy, Office of Science, Office of Basic Energy Sciences and the UChicago Argonne, LLC, representing Argonne National Laboratory.

BACKGROUND

The following description is provided to assist the understanding of the reader. None of the information provided or references cited is admitted to be prior art.

Mechanical oscillators are an essential component of practically every electronic system requiring a frequency reference for time keeping or synchronization and are also widely used in frequency-shift based sensors of mass, force, and magnetic field. Currently, micro- and nano-mechanical oscillators are being developed as an alternative to conventional oscillators, e.g. quartz oscillators, supported by their intrinsic compatibility with standard semiconductor processing and by their unprecedented sensitivity and time response as miniaturized sensing devices. Unfortunately, as the dimensions of the vibrating structures are reduced to the micro- and nano-scale their dynamic response at the amplitudes needed for operation frequently becomes nonlinear, with large displacement instabilities and excessive frequency noise considerably degrading their performance.

SUMMARY

An illustrative system includes an amplifier operably connected to a phase shifter. The amplifier is configured to amplify a voltage from an oscillator. The phase shifter is operably connected to a driving amplitude control, wherein the phase shifter is configured to phase shift the amplified voltage and is configured to set an amplitude of the phase shifted voltage. The oscillator is operably connected to the driving amplitude control. The phase shifted voltage drives the oscillator. The oscillator is at an internal resonance condition, based at least on the amplitude of the phase shifted voltage, that stabilizes frequency oscillations in the oscillator. Other implementations include corresponding methods, apparatuses, and computer-readable media.

The foregoing summary is illustrative only and is not intended to be in any way limiting. In addition to the illustrative aspects, embodiments, and features described above, further aspects, embodiments, and features will become apparent by reference to the following drawings and the detailed description.

BRIEF DESCRIPTION OF THE DRAWINGS

The foregoing and other features of the present disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings.

Figure 1:
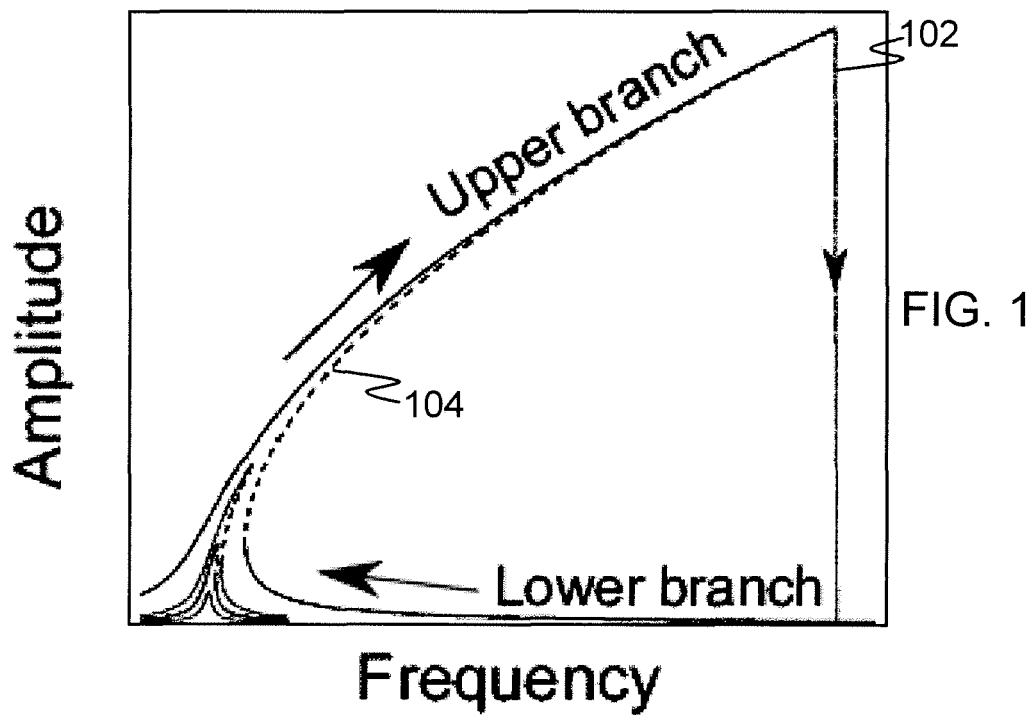
FIG. 1 is an illustration of calculated solutions of a Duffing equation for a clamped-clamped oscillator.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present disclosure, as generally described herein, and illustrated in the figures, can be arranged, substituted, combined, and designed in a wide variety of different configurations, all of which are explicitly contemplated and make part of this disclosure.

DETAILED DESCRIPTION

In one implementation, a general mechanism is provided that stabilizes the oscillation frequency of nonlinear self-sustaining micro- and nano-mechanical resonators. This can be achieved by coupling two different vibrational modes through an internal resonance, where the energy exchange between modes is such that the resonance of one mode absorbs the amplitude and frequency fluctuations of the other, effectively acting as a stabilizing mechanical negative feedback loop. For example, two modes of an oscillator can be coupled together, such that an energy exchange between the two modes occurs. The energy exchange can be such that the amplitude associated with each mode are inversely related. As an example, energy from a first mode can provide energy to a second. The increased energy can increase the amplitude of the second mode and the amplitude of the first mode can be reduced, due to the energy transferred to the second mode.

The changes in the different amplitudes can stabilize the oscillation frequency of nonlinear self-sustaining micro- and nano-mechanical resonators.

One resonator used in micro- and nano-mechanical resonant sensors and frequency references is the clamped-clamped (c-c) beam resonator. This type of structure simplifies fabrication at the nanoscale, allows Lorentz force actuation and electromotive detection, and has much higher resonant frequencies than other structures with similar dimensions. On the other hand, a feature usually considered as a disadvantage of c-c beams is that they have a linear response only for oscillation amplitudes that are small compared to their width. This often limits the amplitude at which they are operated, reducing their dynamic range, power handling capability, and signal to noise ratio. Furthermore, when going from micro- to nano-electromechanical systems (MEMS to NEMS) the linear dynamic range can be reduced to the point where the amplitudes needed for lineal response are below the noise level and, as a consequence, operation in the nonlinear regime is unavoidable. In this regime, unlike in the linear one, the resonant frequency has a strong dependence with the oscillation amplitude, an effect similar to what in the quartz literature is known as the amplitude-frequency (a-f) effect. Since amplitude fluctuations translate into frequency fluctuations, the a-f effect considerably increases the frequency noise of the oscillator and thus the benefits of operating at higher amplitudes are undone by the noise increase inherent to operating in the nonlinear regime.

The dynamics of a c-c beam can be approximated by that of a mass-spring system with a nonlinear restoring force $F_r = -k_1 x - k_3 x^3$, where x is the displacement of the center of the beam, $k_1$ is a linear elastic constant, and $k_3$ is a nonlinear elastic constant caused by the elongation of the beam as it moves laterally. In the case of damped, harmonically driven oscillations the equation of movement is then given by the Duffing equation:

$$m_{eff} \frac{d^2 x}{dt^2} + c \frac{dx}{dt} + k_1 x + k_3 x^3 = F_0 \cos(\omega t)$$

where $m_{eff}$ is the effective mass, c is the damping constant, and $F_0 \cos(\omega t)$ is the driving force with amplitude $F_0$ and frequency $$f = \frac{\omega}{2\pi}.$$

In the case of a c-c beam, $k_3$ is positive. The typical resonance curves, calculated by solving the above Duffing equation, are shown in FIG. 1 for different driving forces. As shown in FIG. 1, the peak frequency is pulled toward higher frequencies as the driving amplitude is increased (a-f effect). For amplitudes larger than a critical amplitude the response follows a hysteresis loop and multivalued regions are formed. When sweeping the driving frequency upward the resonant curve will follow the upper branch, up to the peak frequency 102, where it jumps down, returning through the lower branch. Dashed lines 104 in FIG. 1 represent unstable solutions of the above Duffing equation.

Figure 2:
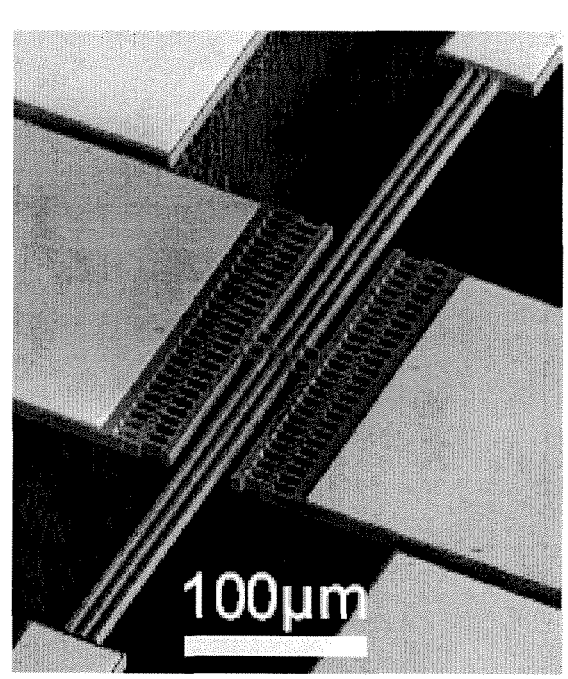
FIG. 2 is a scanning electron micrograph of a c-c bream resonator with comb-drive electrodes for driving and detection.
Figure 3A:
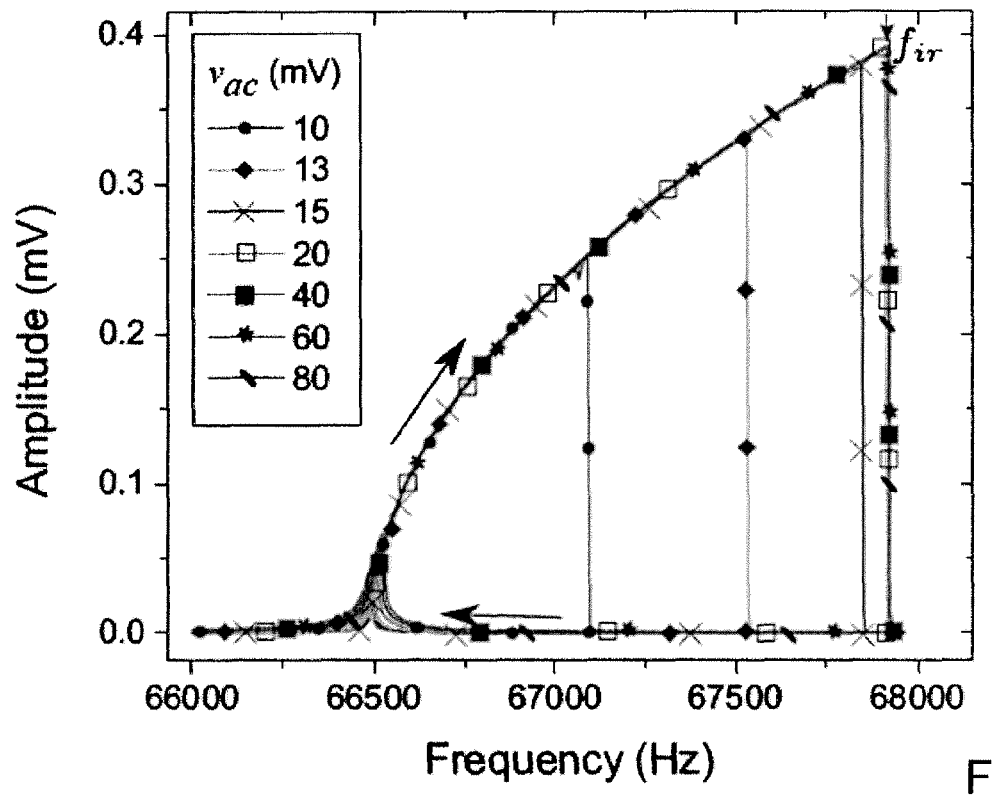
FIG. 3A is an illustration of measured amplitude resonance curves of the c-c bream resonator.

FIG. 3A is an illustration of measured amplitude resonance curves of an illustrative c-c bream resonator illustrated in FIG. 2. The c-c resonator illustrated in FIG. 2 includes three interconnected beams, of length l=500 μm, width w=3 μm, and thickness t=10 μm. Clamped-clamped resonators of different dimensions can also be used. All the measurements were done at room temperature and in vacuum (pressure of $10^{-5}$ mbar), with a $v_{dc}$=6V and different values of $v_{ac}$. For $v_{ac}$<20 mV the peak frequency increases with the driving strength, but for the higher driving voltages the peak frequency remains constant at $f_{ir} \approx 67,920$ Hz, due to the coupling of the first mode with a higher frequency mode through an internal resonance. The electrostatic actuation and detection was implemented with lateral capacitive comb-drive electrodes and the driving force was generated by applying an electric voltage $v(t)=v_{dc}+v_{ac} \sin(\omega t)$ to one of the comb-drive electrodes, where $v_{dc}$ is a DC voltage and $v_{ac}$ is the amplitude of the applied AC voltage.

Figure 3B:
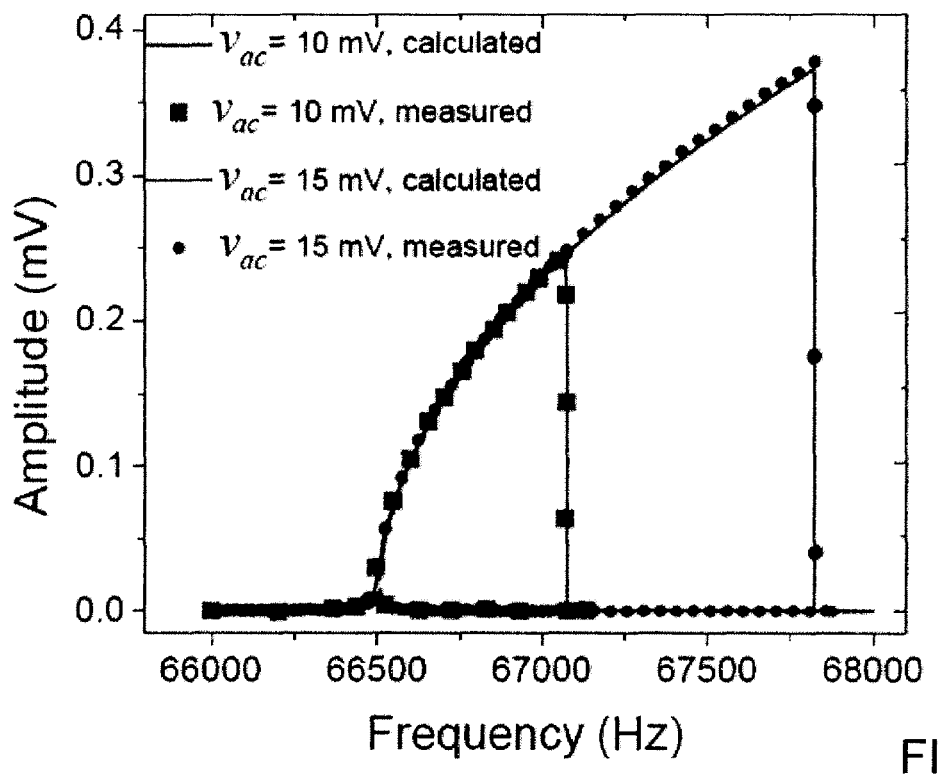
FIG. 3B is an illustration of measured and calculated amplitude values of oscillation involved in the resonant curves shown in FIG. 3A.

In the four curves illustrated in FIG. 3A that correspond to driving voltages $v_{ac} \leq 20$ mV, the peak frequency increases with the driving strength, as expected in a Duffing oscillator. FIG. 3B illustrates the agreement between the measured and calculated amplitude values of oscillation involved in the resonant curves of a c-c resonator. In contrast, the curves corresponding to higher driving voltages all fall to the lower branch at the same frequency $f_{ir}$=67,920 Hz. At this frequency the first mode can couple to a higher frequency mode through an internal resonance. This higher frequency mode drains mechanical energy from the first mode, reducing its amplitude to the point where oscillations at that frequency are unstable, thus causing the amplitude to drop to the lower branch of the resonant curve. Since the dominant nonlinearity is cubic, an internal resonance occurs if this other mode has a frequency three times larger than $f_{ir}$. In this situation, a strong interaction between the first and the higher frequency mode is expected and an internal resonance occurs. When applying larger driving voltages ($v_{ac}$>400 mV) the amplitude curve gets across the internal resonance condition without falling to the lower branch, although with a sharp dip at $f_{ir}$. This can be seen in FIG. 4A. FIG. 4A is an illustration of a resonance curve of a first mode of a c-c beam resonator, with $v_{ac}$=2V and $v_{dc}$=6V. The amplitude curve sees a sharp dip in the upper branch at $f_{ir}$ due to the internal resonance condition part of the mechanical energy of the first mode. At $f_{ir}$, a portion of the mechanical energy is transferred to a higher frequency mode and as a result the amplitude of the first mode is reduced.

The signal produced by the mode at a frequency $3f_{ir}$ can be detected directly by measuring the resonance curve of the first mode while simultaneously monitoring the output power spectrum in the vicinity of $3f_{ir}$. Both modes can be measured capacitively with the same comb-drive electrodes. The first mode is the principal in-plane flexural mode and the capacitance variation of the electrodes has the same frequency of the mechanical oscillations. The higher frequency mode is the principal out of plane torsional mode and in this case the capacitance variation has twice the frequency of the mechanical oscillations. Consequently, while the driving frequency is swept in the vicinity of the internal resonance frequency $f_{ir}$, the spectrum analyzer frequency span is centered at $6f_{ir}$. In this way the output spectrum corresponding to the oscillations of the higher frequency mode at $3f_{ir}$ is detected.

Similarly, in order to measure simultaneously both coupled modes with two different lockin amplifiers, a reference signal near $6f_{ir}$ can be used for the high frequency lockin to detect the oscillations of the higher frequency mode at $3f_{ir}$. This reference signal can also be input into a frequency divider by six and used as the reference for the low frequency lockin, in the vicinity of $f_{ir}$. Additionally this signal can be used to drive the resonator and sweep the resonance curve of the first mode around $f_{ir}$.

Figure 4B:
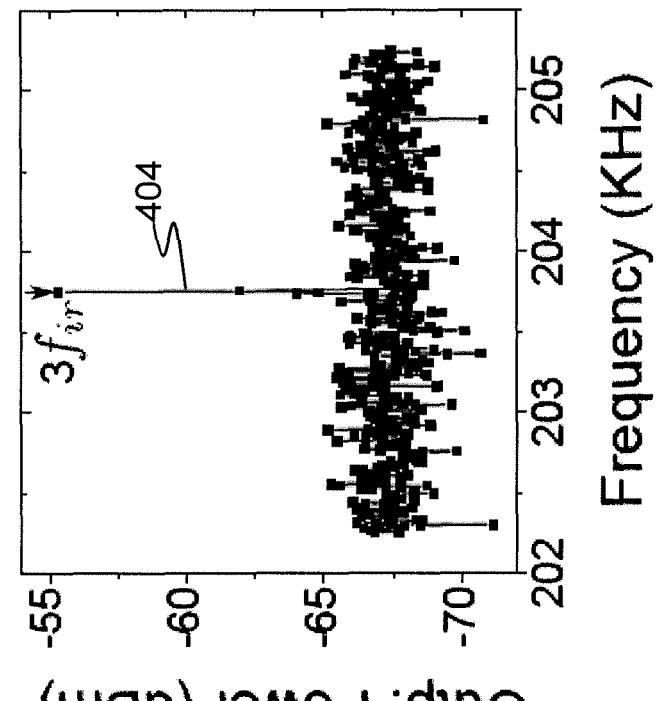
FIG. 4B shows a measured output power spectrum of a higher frequency mode of a c-c beam resonator.
Figure 4A:
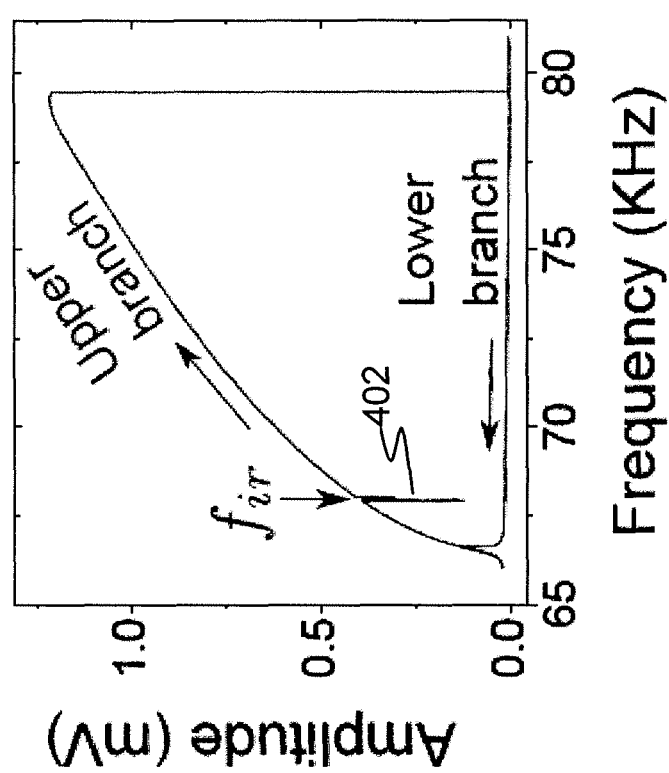
FIG. 4A is an illustration of a resonance curve of a first mode of a c-c beam resonator.

FIG. 4B shows the measured output power spectrum of a higher frequency mode of a c-c beam resonator. The dip 402 illustrated in FIG. 4A corresponds to the resonance peak 404 of the higher frequency mode shown in FIG. 4B. The resonance of the higher frequency mode at $3f_{ir}$ produces a peak 404 in the output power spectrum. No peak is observed in the output power spectrum for driving frequencies different than $f_{ir}$ or when exciting the first mode along the lower branch of the amplitude curve. In addition to the peak 404, the higher frequency mode has a softening nonlinearity, with the hysteresis being observable in its resonance curve (FIG. 5B) and in the amplitude curve of the first mode (FIG. 5A).

Figures 5A, 5B:
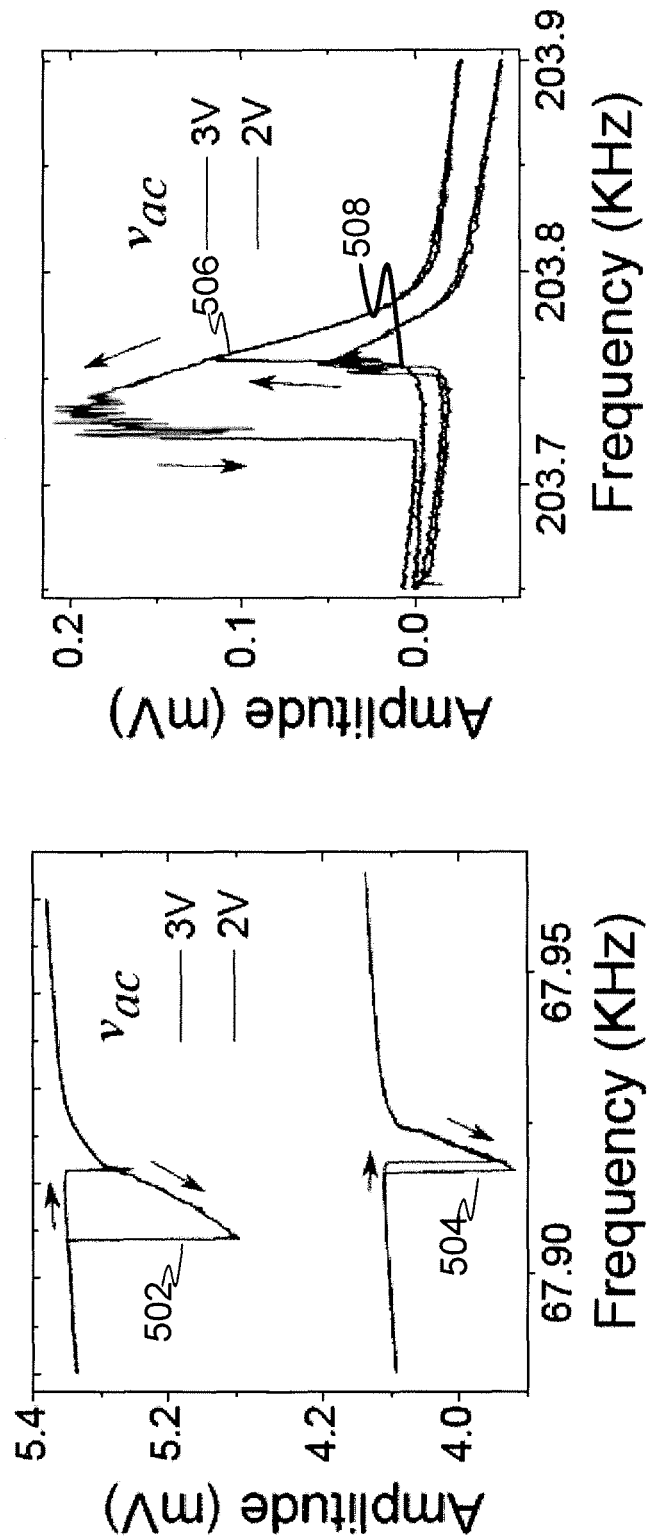
FIGS. 5A and 5B are illustrations of oscillation amplitudes of a first mode and a higher frequency mode.

FIGS. 5A and 5B are illustrations of oscillation amplitudes of a first mode and a second, higher frequency mode. FIG. 5A illustrates the upper branch of the first mode resonance curve, around the internal resonance condition, $f_{ir} \approx 67,920$ Hz, for two different values of $v_{ac}$. FIG. 5B illustrates the oscillation amplitudes of the high frequency mode near $3f_{ir}$, for two different values of $v_{ac}$. A change in the amplitude of the first mode 502 and 504 corresponds to an opposite variation of the amplitude of the higher frequency mode 506 and 508, respectively. This can be caused by a transfer of mechanical energy between the modes at the internal resonance condition. The results illustrated in FIGS. 5A and 5B show that there is a mode at $3f_{ir}$ corresponding to the first out-of-plane torsional mode in this device. This mode shows softening nonlinearities due to the electrostatic potential introduced by the driving and detection voltages in the comb drives as illustrated in FIG. 5B.

Figure 6:
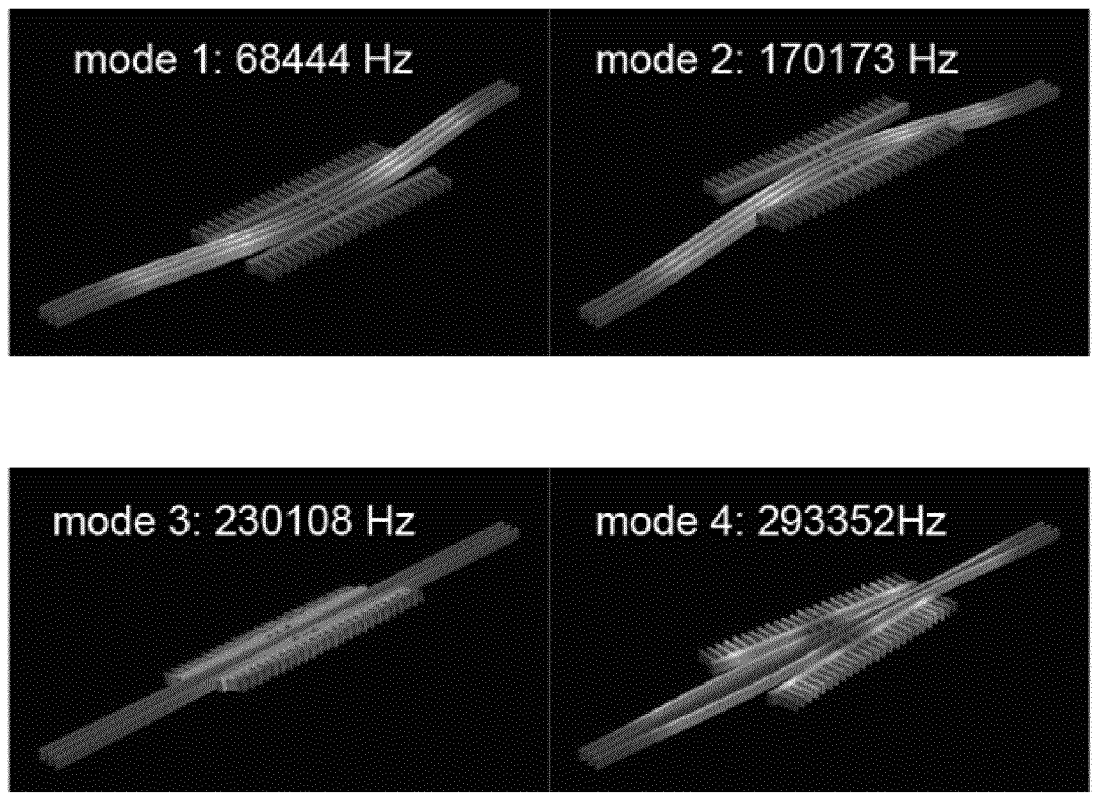
FIG. 6 is an illustration of modes of a c-c resonator.

A modal analysis of a c-c resonator can also be done using a finite element simulation software to determine which is the mode with natural frequency $3f_{ir} \approx 203,760$ Hz that couples with the first mode at the internal resonance condition. FIG. 6 is an illustration of modes of a c-c resonator obtained using a finite element method simulation software. The simulation shows that, taking into account the tolerance of the fabrication process, two different modes can have this natural frequency: one is the principal flexural out-of-plane mode (mode 2, $f \approx 230$ KHz) and the other is the principal torsional mode (mode 3, $f \approx 170$ KHz). These two modes have both an out-of-plane type of motion and they can both be detected capacitively with the comb drive electrodes. However, in contrast to the case of the first mode, their capacitive variation has twice the frequency of their mechanical oscillations and thus the output signal must be detected at double the frequency of the driving force (2f detection).

Additionally, mode 2 is flexural, like the first mode, and should show a hardening nonlinearity due to the geometry of the clamped-clamped beam resonator, as the first mode does. In contrast, since mode 3 is torsional it can show a softening nonlinearity, if any, due to the electrostatic potential introduced by the driving and detection electrodes. Therefore, since the mode at $3f_{ir}$ shows a softening nonlinearity at high amplitudes, mode 3 couples with the first mode at the internal resonance.

In brief, when the first mode is driven along the upper branch of the nonlinear resonant curve with a frequency $f_{ir}$, an internal resonance occurs. At this frequency, the first mode couples with another mode, with natural frequency $3f_{ir}$, driving it into resonance and resulting in a transfer of mechanical energy between the two modes. The energy exchange between modes is such that if the amplitude of the second mode increases it draws energy from the first mode and thus decreases its amplitude. Similarly, if the amplitude of the second mode decreases then the amplitude of the first mode is increased.

This energy transfer between the two modes can have a direct impact on the amplitude stability of the first mode and can be used as a mechanical negative feedback to stabilize both its amplitude and frequency. To illustrate this stabilization effect, the resonator can be at its internal resonance condition, with the first mode oscillating in the upper branch of the resonance curve and the higher frequency mode oscillating just below its resonant frequency at $3f_{ir}$, driven by the oscillations of the first mode. At this point, fluctuations can increase the amplitude of the first mode resulting in increased frequency due to the a-f effect. This increase drives the higher frequency mode oscillation closer to the peak of its resonance and thus its amplitude increases. As a result, more energy is drawn from the first mode, decreasing its amplitude and frequency, thus effectively opposing the increase in amplitude and frequency produced by noise. On the other hand, if the amplitude of the first mode decreases then its frequency also decreases. This moves the frequency of the higher frequency mode oscillation away from the resonance peak, thus decreasing its amplitude. Consequently, less energy is drawn from the first mode and its amplitude and frequency increase. In other words, the higher frequency mode is effectively stabilizing the amplitude and frequency fluctuations of the first mode.

A theoretical description of the proposed stabilization mechanism can be obtained by introducing a coupling term into the Duffing equation, described above, and by adding a second equation describing the high-frequency mode dynamics. This set of equations can be solved analytically and provides a theoretical analysis for the negative feedback effect responsible for stabilizing the oscillator's frequency.

Frequency stabilization by internal resonance in a clamped-clamped micro-oscillator is due to the transfer of energy from the first oscillation mode to the principal torsional mode, e.g., a higher frequency mode. In the self-sustaining configuration, increasing the driving force causes a growth of both the amplitude and, due to nonlinear effects, the frequency $f_1$ of the first mode. When $f_1$ reaches one third of the frequency $f_3$ of the principal torsional mode, internal resonance takes place, and energy is transferred from the former to the latter. The coupling between the two modes is mediated by the $3f_1$ component of the first mode oscillations (1:3 internal resonance). As a result of this energy transfer, the growth rate of the amplitude and the frequency of the first mode decreases abruptly and, hence, both become stabilized.

Figure 9:
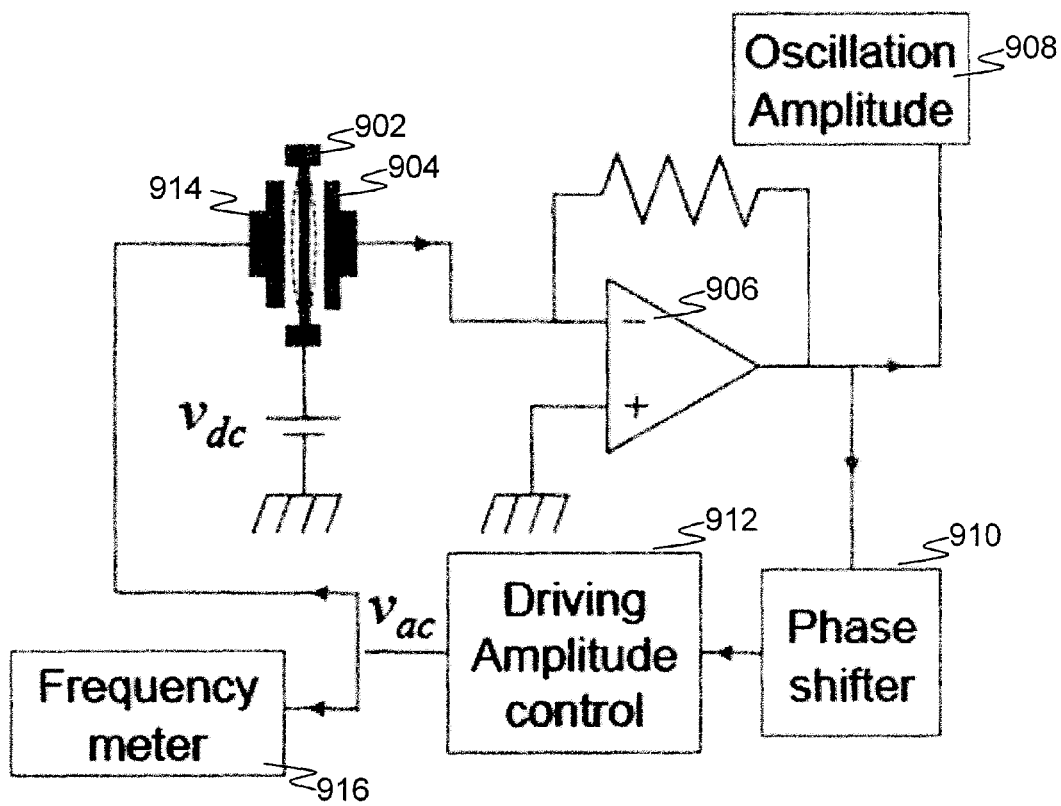
FIG. 9 is a circuit schematic of a c-c resonator in a closed loop configuration that maintains self-sustained oscillations.

To verify the stabilization mechanism, in one implementation, the resonator is driven in a closed loop configured where the oscillations are self-sustained at approximately 500 Hz below $f_{ir}$. FIG. 9 is a circuit schematic of a c-c resonator 902 in a closed loop configuration that maintains self-sustained oscillations. The motion of the resonator 902 can be detected capacitively, for example, using a detection electrode 904 that includes a capacitor. The capacitance variation of the voltage biased comb-drive electrode generates a current that is introduced into a current amplifier 906. The amplifier 906 produces a voltage output proportional to the oscillation amplitude 908. The voltage output can be first phase shifted using a phase shifter 910. For example, the phase shifter 910 can be an active analog implementation of an allpass filter. The phase shifted voltage can then be used as input of a phase-locked loop (PLL) in a lockin-amplifier (external reference input). The reference output of the lockin amplifier is phase locked to the input reference and its amplitude can be set by a driving amplitude control 912. The driving amplitude control 912 can include an internal function generator that sets the amplitude to a specified value.

Thus, the resulting signal at the output of the PLL is phase locked to the detection signal but phase shifted and with a constant amplitude that can be set independently of the amplitude of the oscillations. This resulting signal can be input into a driving electrode 914 that can be used to drive the resonator 902. The $v_{ac}$ input can be increased in order to reach the internal resonance condition. The resulting signal can also be input in a frequency meter 916 to measure the frequency of the oscillations. The frequency meter 916 can be a digital frequency counter. The phase shift between the excitation and the detection signal determines the point in the resonance curve where the resonator 902 is phase locked. For instance, to operate the oscillator 902 in the peak of the resonance curve, the phase shift can be set to $$\frac{-\pi}{2}.$$

In one example, the $$\frac{-\pi}{2}$$

phase shift was used to produce a maximum amplitude of oscillation.

Figure 7A:
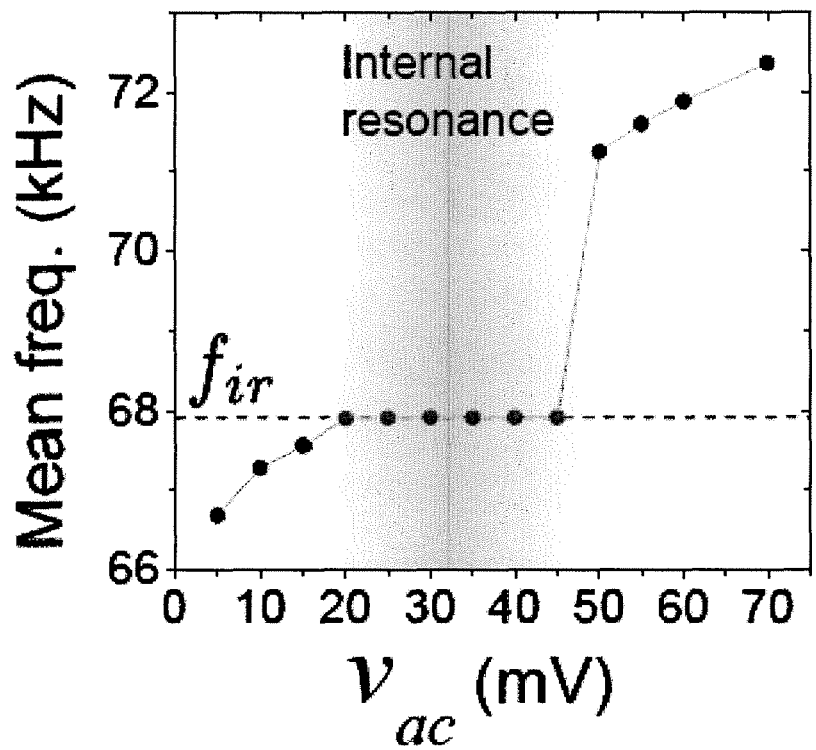
FIG. 7A is an illustration of a mean frequency of oscillations of a first mode.
Figure 7B:
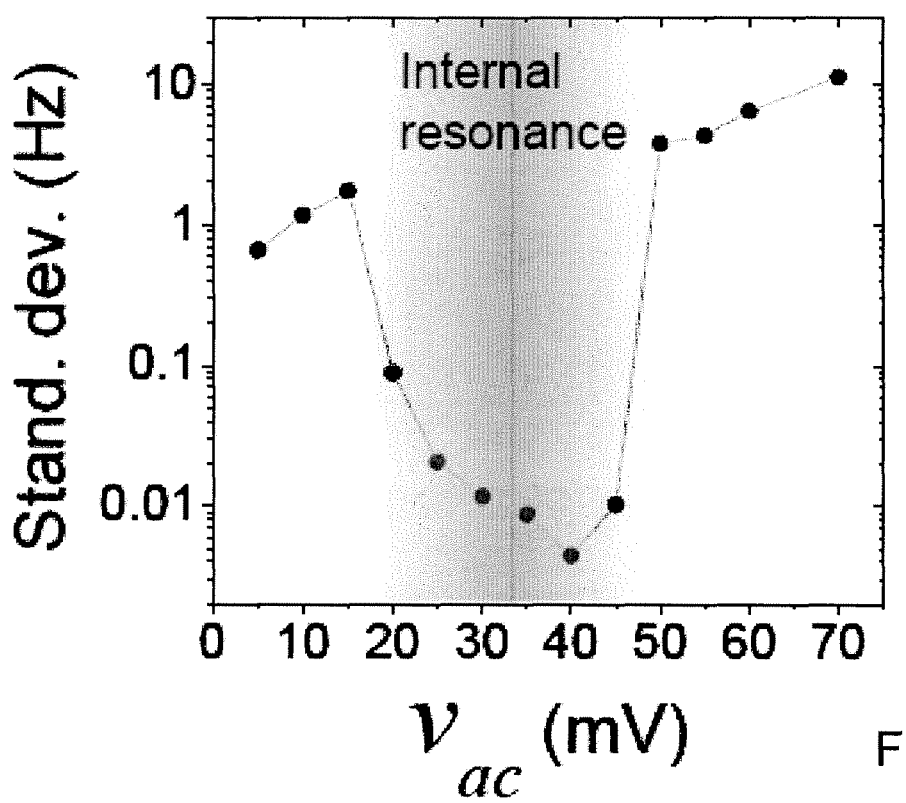
FIG. 7B is an illustration of a standard deviation of a self-sustaining oscillator's frequency.

Measurements of the frequency of oscillations as a function of time for 120 seconds, using an averaging time of 0.1 seconds for each point for various values of $v_{ac}$, were taken. Using this data, the mean frequency and the standard deviation of the frequency as a function of $v_{ac}$ can be determined. The results of one such experiment are shown in FIGS. 7A and 7B. FIG. 7A is an illustration of a mean frequency of oscillations of a first mode. The frequency versus driving amplitude curve flattens when the internal resonance condition is reached at $f_{ir}$. FIG. 7B is an illustration of a standard deviation of a self-sustaining oscillator's frequency on a logarithmic scale. The frequency fluctuations, shown in FIG. 7B, are substantially reduced in the internal resonance condition.

For driving voltages lower than 20 mV the mean frequency increases with voltage (FIG. 7A), as expected in a Duffing resonator. In this driving range the noise in the frequency also increases with voltage (FIG. 7B) because the oscillator becomes more nonlinear and thus the a-f effect increases.

At $v_{ac} \approx 20$ mV the frequency value levels off and remains almost constant as $v_{ac}$ is further increased (FIG. 7A). Point 702, corresponding to $v_{ac} \approx 20$ mV, is the onset of the internal resonance condition, where the high frequency mode couples with the first mode and stabilizes both its amplitude and frequency of oscillation. Consequently, as shown in FIG. 7B, the frequency fluctuations drop substantially, from 1.75 Hz to 4 mHz, at almost 400 times, giving a frequency stability $$\sqrt{\frac{1}{N-1} \sum_{i=1}^{N} \left(\frac{f_i - \bar{f}}{\bar{f}}\right)^2} \approx 0.06 \text{ ppm}.$$

Figure 8:
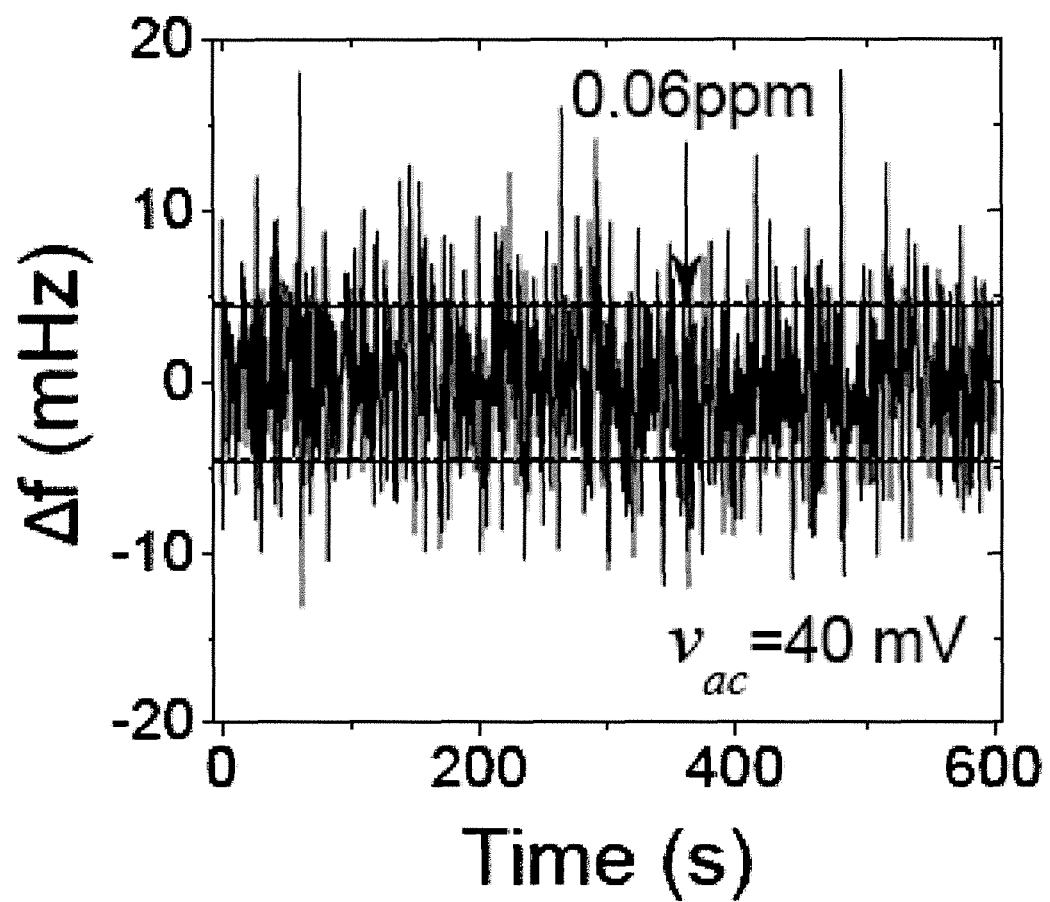
FIG. 8 is an illustration of instantaneous frequency variations at an internal resonance condition.

FIG. 8 is an illustration of instantaneous frequency variations at an internal resonance condition over time for $v_{ac} \approx 40$ mV. Frequency stability measured over the course of minutes was excellent. The short-term frequency fluctuation of our oscillator, working deep in the nonlinear regime, is comparable to state-of-the-art MEMS/NEMS linear oscillators.

The stabilization mechanism can be evaluated by measuring the standard deviation of the frequency as the driving voltage is increased and the oscillator enters the internal resonance condition. The stabilization mechanism can also be described using a more complete description of the noise in the oscillator, which is given by the fractional frequency fluctuations averaged over an interval $\tau$, as a function of that averaging time $\tau$. This is known as an Allan deviation $\sigma_y(\tau)$ and can be expressed as $$\sigma_y(\tau) = \sqrt{\frac{1}{2(N-1)} \sum_{i=2}^{N-1} (\bar{y}_{i+1}^\tau - \bar{y}_i^\tau)^2}$$

where $\bar{y}_i^\tau$ are the relative frequency fluctuations averaged over the ith discrete time interval of $\tau$.

Figures 10A, 10B:
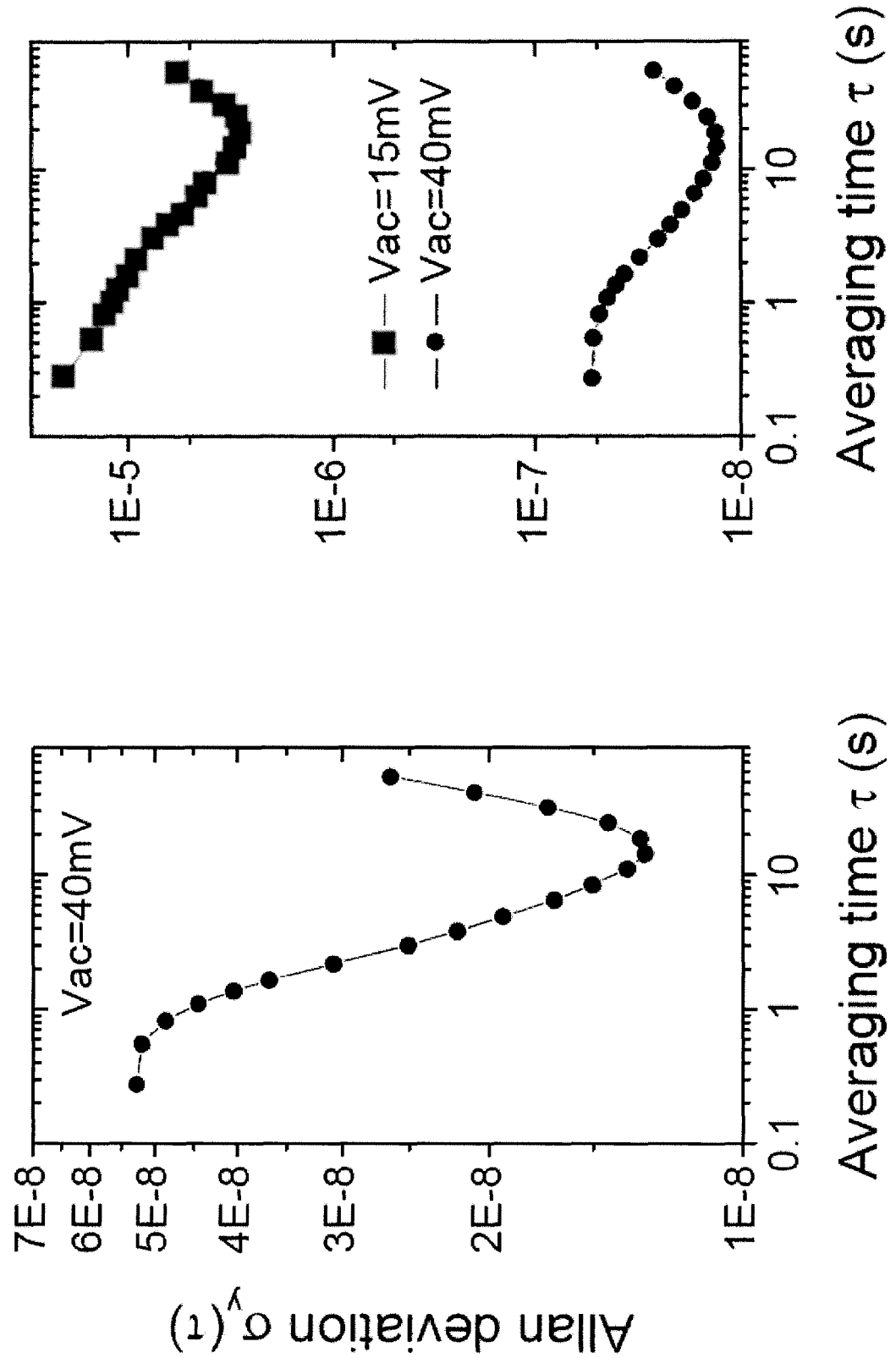
FIG. 10A is an illustration of Allan deviations of a micromechanical oscillator at 40 mV.
FIG. 10B is an illustration of Allan deviations of a micromechanical oscillator at 15 mV and 40 mV showing the effect of the stabilization mechanism.

FIG. 10A is an illustration of Allan deviations of a micromechanical oscillator at the internal resonance condition at 40 mV. The behavior of the curve is as expected in a mechanical oscillator: for short averaging times the deviation diminishes with the averaging time (up to 10 s approximately) because the fluctuations are dominated by white noise, and for longer times the deviation increases with averaging time because the noise process is dominated by random walk of frequency. FIG. 10B is an illustration of Allan deviations of a micromechanical oscillator at 15 mV and 40 mV showing the frequency stabilization based on one implementation of the stabilization mechanism.

When the driving amplitude is further increased, the end of the internal resonance condition is reached. At that point, the high frequency mode stops opposing the amplitude and frequency increase of the first mode and the frequency jumps to the value expected for a Duffing resonator. Additionally, since the stabilizing action of the high frequency mode is no longer in effect, the frequency noise increases abruptly.

The frequency noise is induced by undesired forces that affect both the amplitude and, through the a-f effect, the frequency of the oscillations. Examples of these forces are the noise in the driving voltage, variations in pressure and temperature, random vibrations and/or contamination of the resonator element. The internal resonance mechanism reduces the sensitivity of the oscillation amplitude to all of these force fluctuations. If additional stabilization methods are used, such as temperature compensation, then the effects of reducing the noise in the external forces and of using the internal resonance stabilization will be additive. The former will reduce the fluctuations in the forces affecting the oscillation amplitude and the latter will reduce the sensitivity of the oscillation amplitude to these fluctuations.

The described method for stabilizing the frequency can be applied to a wide range of micro and nano-mechanical oscillators. In some implementations, coupling can be obtained not only with the torsional mode but also with the out-of-plane flexural mode, which can make the design easy to implement in c-c beam resonators. For instance, in a single c-c beam with length l, width w and thickness t, the resonant frequency of the first flexural mode that oscillates in the direction of w is $$\omega_1 = 6.47 \sqrt{\frac{E}{\rho}} \frac{w}{L^2},$$

where E is the Young modulus, $\rho$ is the density of the beam, and L is the length of the beam. Similarly, the mode that oscillates in the direction of t has a resonant frequency $$\omega_2 = 6.47\sqrt{\frac{E}{\rho}\frac{t}{L^2}}$$

and thus $$\frac{\omega_2}{\omega_1} = \frac{t}{w}.$$

Therefore, an internal resonance can be obtained when t>3w so that $\omega_2 > 3\omega_1$. Thus, by driving the first mode with an appropriate force, the first mode can be made to resonate at a frequency equal to $\frac{1}{3}\omega_2$. The limitations in the driving force and in the attainable frequency detuning of the first mode sets the upper limit for the difference between $\omega_1$ and $\frac{1}{3}\omega_2$. This reasoning holds independently of the frequency of the resonator and the design can be applied in high-frequency NEMS where the linear dynamic range imposes severe limitations to the signal to noise ratio, allowing large displacements with excellent frequency stability.

Figure 11:
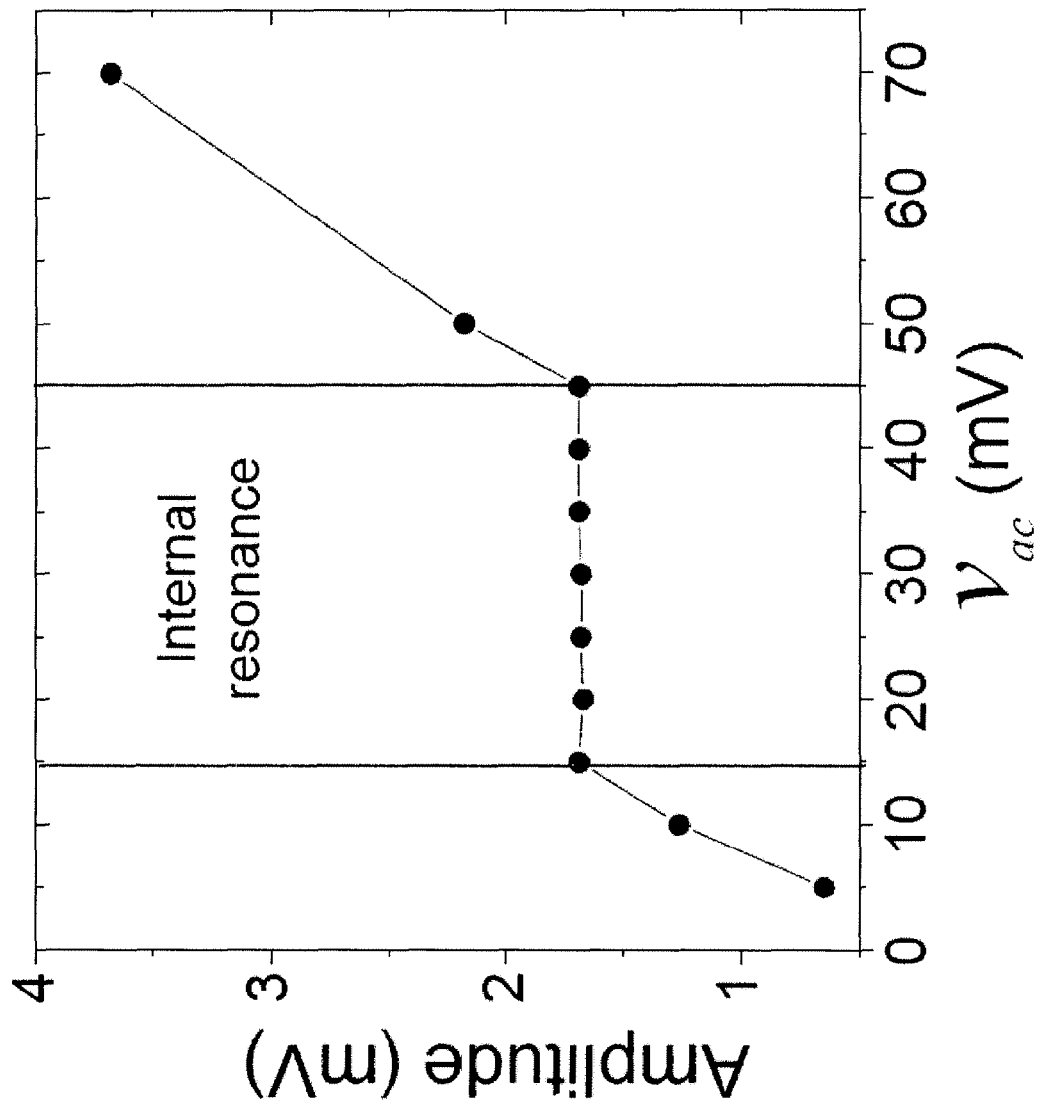
FIG. 11 is an illustration of the amplitude of the first mode oscillations.

In addition to frequency stabilization, the amplitude of the first mode can also be stabilized. The fluctuations in the frequency of the nonlinear self-sustained oscillator are mainly due to fluctuations in the amplitude of oscillation. In the internal resonance condition the amplitude of the first mode is stabilized by the exchange of energy with the second mode, which stabilizes the frequency. FIG. 11 is an illustration of the amplitude of the first mode oscillations. Similarly to what happens to the frequency, as shown in FIG. 7A, the amplitude versus driving force curve flattens when the internal resonance condition is reached at $f_{ir}$. The amplitude in mV may differ from that of the open loop curves of FIG. 3A due to different settings in the current preamplifier and lockin amplifier gains.

Implementations of the current invention include a frequency stabilization mechanism that is intrinsic to self-sustained micro- and nano-mechanical resonators operating in the nonlinear regime. This mechanism demonstrates that very low frequency noise performance is possible in the nonlinear regime. In some implementations, the frequency stabilization mechanism can be used in the broad field of miniaturized mechanical oscillators for frequency references, and can also be used in frequency-shift-based detectors. For frequency-shift-based detectors, the same configuration described above can be used. With the first mode stabilized at $f_{ir}$, the device is sensitive to variations in the resonant frequency of the higher frequency mode, induced, for example, by changes in mass or force. This is so because these variations modify the value of $f_{ir}$ and thus the frequency of the self-sustained oscillations of the low frequency mode. In this way, the resonant frequency of the high frequency mode, which is linear and has good stability but has low amplitude, could be followed by detecting the nonlinear low frequency mode, which has a much larger amplitude, increasing the signal to noise ratio. In addition, in some implementations the frequency stabilization mechanism can be used in mechanical energy storage with resonators, where energy input at low frequencies could be stored in higher frequency modes, thus using the multiple degrees of freedom of the resonator to extend its energy storage capacity.

Figure 12A:
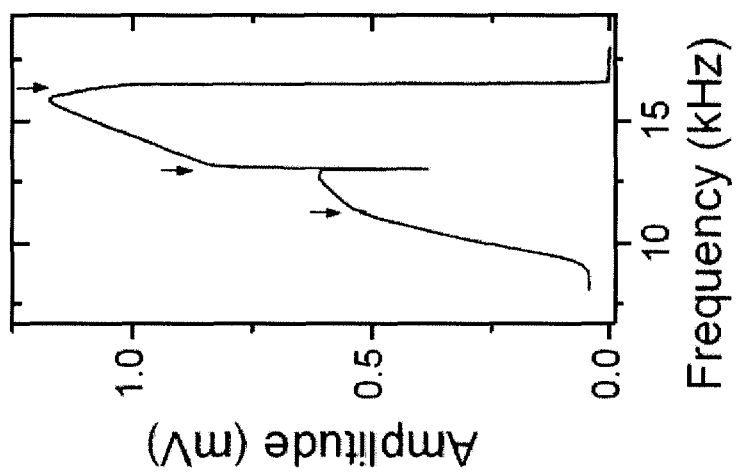
FIGS. 12A-12C are illustrations of internal resonance in different c-c resonators.
Figure 12B:
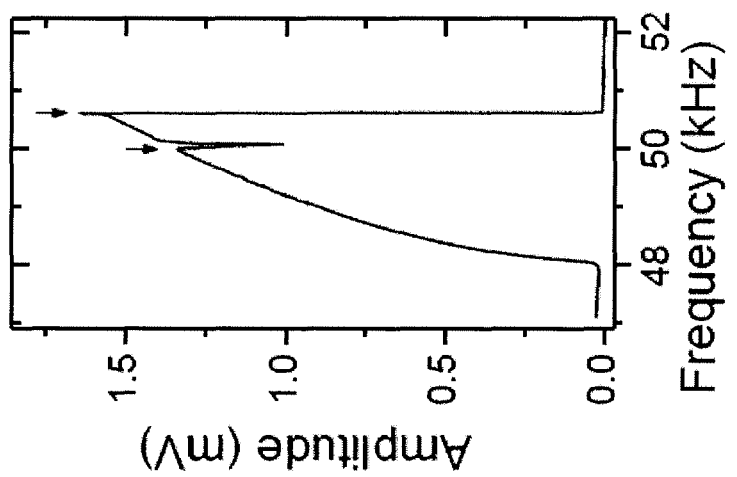
Figure 12C:
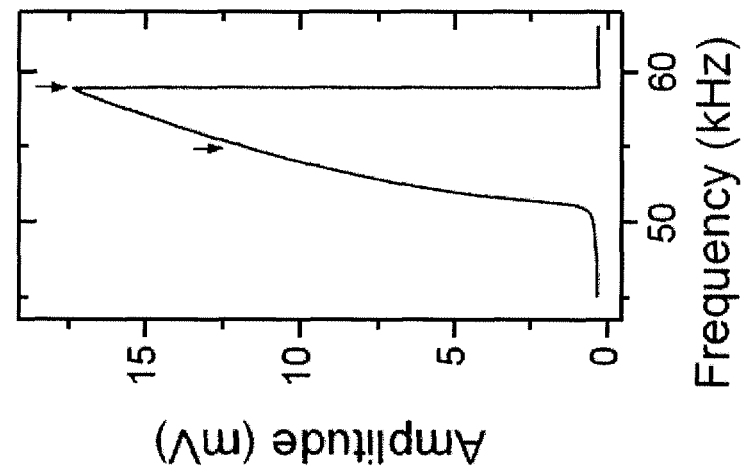

As noted above, the described stabilization mechanism can be used in various resonators. In several resonators, different than the one described above, the coupling between the first mode and higher frequency modes at the internal resonance condition was detected. Depending on the frequency of the higher modes relative to the first mode, and the detuning reached with the maximum driving strength, one or more internal resonance conditions were detected. In all cases the lower frequency mode was the first in-plane flexural mode, but the high frequency modes were both in-plane and out-of-plane, primary and secondary flexural modes, and also torsional modes. Therefore, the possibility of coupling with different types of modes gives great flexibility for the design of oscillators using this stabilization mechanism. FIGS. 12A-12C are illustrations of internal resonance in different c-c resonators. The c-c resonators differ in their dimensions and in the number of their parallel interconnected beams. The vertical arrows indicate the presence of an internal resonance condition. The c-c resonator used to create FIG. 12A had a beam length of 500 µm, thickness of 10 µm, width of 2 µm, and 6 beams. The c-c resonator used to create FIG. 12B had similar dimensions to the first c-c resonator but with a coating of 20 nm of chrome and 500 nm of gold. The c-c resonator used to create FIG. 12C had a beam length of 1000 µm, thickness of 25 µm, width of 2 µm, and 1 beam.

The herein-described subject matter sometimes illustrates different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled" to each other to achieve the desired functionality, and any two components capable of being so associated can also be viewed as being "operably couplable", to each other to achieve the desired functionality. Specific examples of operably couplable include but are not limited to physically mateable and/or physically interacting components and/or wirelessly interactable and/or wirelessly interacting components and/or logically interacting and/or logically interactable components.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

The foregoing description of illustrative embodiments has been presented for purposes of illustration and of description. It is not intended to be exhaustive or limiting with respect to the precise form disclosed, and modifications and variations are possible in light of the above teachings or may be acquired from practice of the disclosed embodiments. It is intended that the scope of the invention be defined by the claims appended hereto and their equivalents.

What is claimed is:

1. A system comprising:
    an amplifier operably connected to a phase shifter, wherein the amplifier is configured to amplify a voltage from an oscillator;
    the phase shifter operably connected to a driving amplitude control, wherein the phase shifter is configured to phase shift the amplified voltage;
    the driving amplitude control configured to set an amplitude of the phase shifted voltage; and
    the oscillator operably connected to the driving amplitude control, wherein the phase shifted voltage drives the oscillator, wherein the oscillator is at an internal resonance condition based at least on the amplitude of the phase shifted voltage, and wherein the internal resonance condition stabilizes frequency oscillations in the oscillator,
    wherein the oscillator comprises a first mode and a second mode, wherein energy is transferred from the first mode to the second mode in the resonance condition, and wherein the transferred energy stabilizes the frequency oscillations in the oscillator.
2. The system of claim 1, wherein the transferred energy stabilizes the amplitude oscillations in the oscillator.
3. The system of claim 1, wherein the first mode comprises a first amplitude, wherein the second mode comprises a second amplitude, wherein the energy transferred to the second mode increases the second amplitude and decreases the first amplitude.
4. The system of claim 1, wherein the resonance condition stabilizes amplitude oscillations in the oscillator.
5. The system of claim 1, wherein the amplified voltage is proportional to an oscillation amplitude of the oscillator.
6. The system of claim 1, wherein the oscillator is a nano-mechanical oscillator.
7. The system of claim 1, wherein the oscillator is a micro-mechanical oscillator.
8. The system of claim 1, wherein the oscillator is a clamped-clamped beam oscillator.
9. A method comprising:
    amplifying a voltage, using an amplifier, from an oscillator;
    phase shifting the amplified voltage;
    setting an amplitude of the phase shifted voltage; and
    driving the oscillator using the phase shifted voltage, wherein the phase shifted voltage drives the oscillator, wherein the oscillator is at an internal resonance condition based at least on the amplitude of the phase shifted voltage, and wherein the internal resonance condition stabilizes frequency oscillations in the oscillator,
    wherein the oscillator comprises a first mode and a second mode, wherein energy is transferred from the first mode to the second mode in the resonance condition, and wherein the transferred energy stabilizes the frequency oscillations in the oscillator.
10. The method of claim 9, wherein the transferred energy stabilizes the amplitude oscillations in the oscillator.
11. The method of claim 9, wherein the first mode comprises a first amplitude, wherein the second mode comprises a second amplitude, wherein the energy transferred to the second mode increases the second amplitude and decreases the first amplitude.
12. The method of claim 9, wherein the resonance condition stabilizes amplitude oscillations in the oscillator.
13. The method of claim 9, wherein the amplified voltage is proportional to an oscillation amplitude of the oscillator.
14. The method of claim 9, wherein the oscillator is a nano-mechanical oscillator.
15. The method of claim 9, wherein the oscillator is a micro-mechanical oscillator.
16. The method of claim 9, wherein the oscillator is a clamped-clamped oscillator.
17. A clamped-clamped oscillator comprising:
    an amplifier operably connected to a phase shifter, wherein the amplifier is configured to amplify a voltage from the clamped-clamped oscillator;
    the phase shifter operably connected to a driving amplitude control, wherein the phase shifter is configured to phase shift the amplified voltage;
    the driving amplitude control configured to set an amplitude of the phase shifted voltage; and
    the clamped-clamped oscillator operably connected to the driving amplitude control, wherein the phase shifted voltage drives the clamped-clamped oscillator, wherein the clamped-clamped oscillator is at an internal resonance condition based at least on the amplitude of the phase shifted voltage, wherein the clamped-clamped oscillator comprises a first mode and a second mode, wherein energy is transferred from the first mode to the second mode in the internal resonance condition, wherein the transferred energy stabilizes frequency oscillations in the clamped-clamped oscillator, and wherein the transferred energy stabilizes amplitude oscillations in the clamped-clamped oscillator.

18. The clamped-clamped oscillator of claim 9, wherein the amplified voltage is proportional to an oscillation amplitude of the clamped-clamped oscillator.

* * * * *